Figure 1:
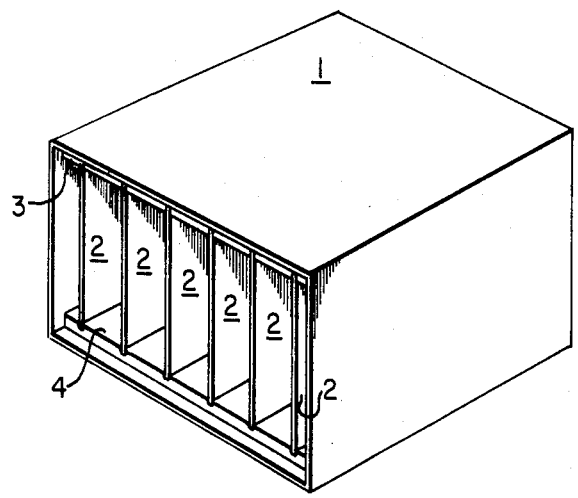

United States Patent [19]
Milc

[11] Patent Number: 4,521,063
[45] Date of Patent: Jun. 4, 1985

[54] PRINTED CIRCUIT BOARD LOCK
[75] Inventor: Thomas A. Milc, Curran, Canada
[73] Assignee: Mitel Corporation, Ontario, Canada
[21] Appl. No.: 394,424
[22] Filed: Jul. 1, 1982
[30] Foreign Application Priority Data Feb. 19, 1982 [CA] Canada ................................. 396666

[51] Int. Cl.³ .......................... H01R 13/54; H05K 1/14
[52] U.S. Cl. ............................ 339/17 LM; 339/17 M;
339/45 M; 339/75 MP
[58] Field of Search ............ 339/17 M, 17 LM, 45 R,
339/45 M, 75 MP; 361/412, 413

[56] References Cited
U.S. PATENT DOCUMENTS

| | | | |
|---|---|---|---|
| 2,993,187 | 7/1961 | Bisbing et al. ................ | 339/17 LM |
| 3,451,034 | 6/1969 | Beale ............................ | 339/45 R X |
| 3,476,258 | 11/1969 | Dorsett ........................ | 339/17 M X |
| 4,083,616 | 4/1978 | McNiece et al. ................ | 339/45 M |
| 4,301,494 | 11/1981 | Jordan ........................ | 339/45 M X |

Primary Examiner—Z. R. Bilinsky
Attorney, Agent, or Firm—Laff, Whitesel, Conte & Saret

[57] ABSTRACT

A lock for retaining a printed circuit board within a frame, which can be used adjacent opposite front covers of the front edge of the printed circuit board to increase the structural rigidity of the frame when locked. This allows the printed circuit boards to be shipped within the frame direct from the factory within an entire fully tested system, with reliability, avoiding damage which often previously occurred due to vibrations and bouncing during transportation. Each lock is comprised of a lever, a protrusion for rotatably attaching the lever to the printed circuit board at a fulcrum point spaced from the axis of the lever, and a latch fixed to the lever at a position closer to the lever and closer to one end of the lever than the fulcrum point, whereby the latch can be rotated over-center relative to the fulcrum point into a cooperating hook and locked therein as the lever is rotated about the fulcrum point.

15 Claims, 6 Drawing Figures

PRINTED CIRCUIT BOARD LOCK

This invention relates to the field of printed circuit boards and particularly to a printed circuit board lock.

Printed circuit boards are commonly retained parallel to each other in a housing, usually in a vertical orientation. During installation, the boards are pushed into the housing between upper and lower guides, which fix the planes in which the printed circuit boards are held. As each printed circuit board is pushed into final position, its edge, or a connector attached to its edge is forced into contact with a mating connector.

While the force of entry into the mating connector is usually sufficient to retain a printed circuit board in position, transportation of the equipment sometimes causes sufficient vibration that the printed circuit board can become released from the connector. While the printed circuit board can be pushed back into mating position once the equipment is installed, thus re-establishing operability, vibration of the printed circuit board during transportion and flexure of the housing during bumping sometimes causes damage to the board, its contacts or the connector.

A lever is often used at the front of the printed circuit board to aid insertion and extraction of the board. The lever is typically rotatably fixed to the bottom front edge of the printed circuit board, one end of the lever fitting into a slot in front of and below the printed circuit board. Pushing the handle of the lever forces the printed circuit board into place and into engagement with a connector.

However, it has been found that the lever is unsatisfactory in many instances. Where a substantial number of printed circuit boards exhibit considerable weight in the housing, or where the printed circuit board housing structural members themselves resiliently bend under this influence or their own weight during bouncing in transportion, the printed circuit boards undergo substantial stress and sometimes are vibrated loose and are damaged. As a result the equipment sometimes does not work upon installation, requiring attendance of a serviceman and subsequent loss of time, money and goodwill.

It is therefore important to ensure that the printed circuit boards are retained solidly in position within their housing, and particularly during the high vibration and bouncing often incurred during transportation. The present invention is a printed circuit board lock which securely retains printed circuit boards in position during such episodes, with a high degree of security, and in one embodiment causes the printed circuit boards to become structural members of the housing, increasing its rigidity and resistance to flexure.

The subject printed circuit board lock utilizes a lever which is rotatably fixed to the front of a printed circuit board adjacent one edge, and has a latch which is positioned such that when the lever is pushed toward the front edge of the printed circuit board, the latch rotates into an over-center position and becomes hooked. With the lever retained in this position, the printed circuit board is locked into its position.

In general, the invention is a printed circuit board lock comprising a lever, a protrusion for rotatably attaching the lever to the printed circuit board at a fulcrum point spaced from the axis of the lever, and a latch fixed to the lever at a position closer to the lever and closer to one end of the lever than the fulcrum point, whereby the latch can be rotated over-center relative to the fulcrum point into a cooperating hook and locked therein as the lever is rotated about the fulcrum point.

Preferably the printed circuit board includes a guide for fixing the shortest distance between the fulcrum point and the bottom of the mouth of the hook, as the printed circuit board is slid edge-wise past the hook via the guide, the distance being no shorter than the distance between the fulcrum point and the edge of the latch opposite the fulcrum point.

More particularly, the latch is comprised of a protrusion having an orthogonal axis parallel to the axis of the fulcrum. It should have a periphery opposite to the lever which describes at least a 180° segment of a circle extending from a line parallel to the lever and preferably passing through the axis of the fulcrum. And has an indentation on the side of the lever which is cooperatively shaped to accept a lip of the hook.

When the latch is positioned within the hook, and the board is positioned between guides, and mated to its connector, the board is retained from movement in all directions. With another latch noted within a hook across the other side of the board, the board being locked between the two; the board forms a structural member between the top and bottom of the housing, increasing its rigidity and resistance to flexure.

Figure 5:
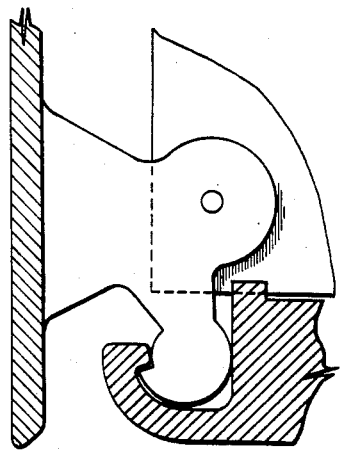
Figure 4:
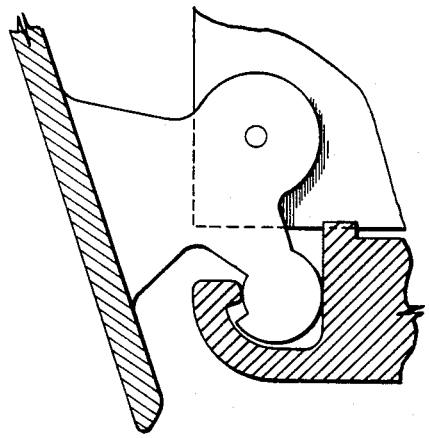
Figure 3:
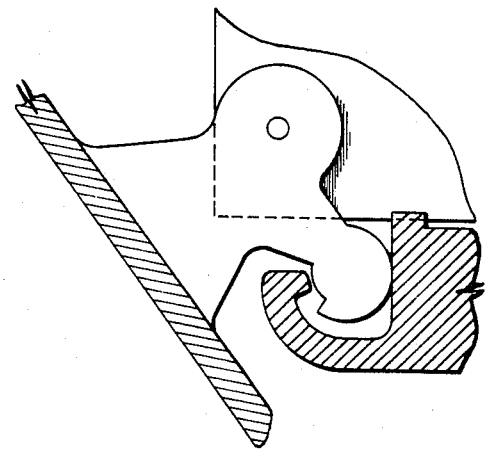
Figure 2:
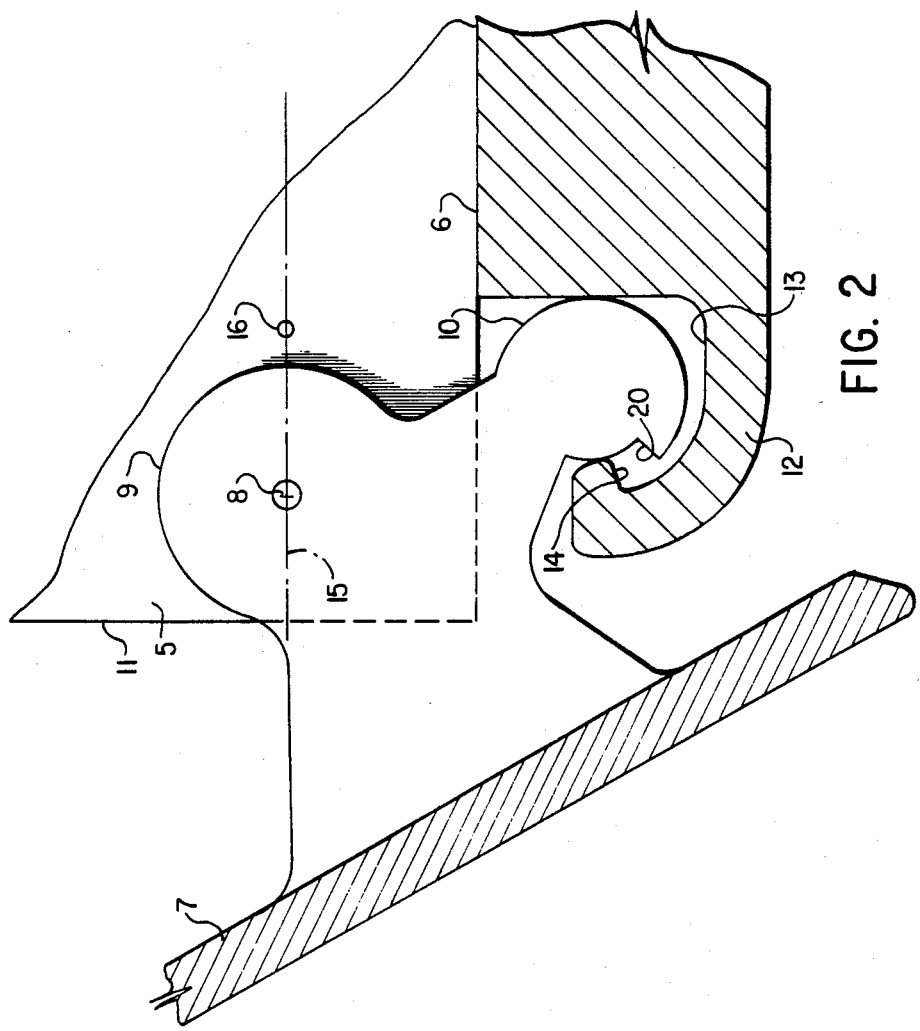
Figure 6:
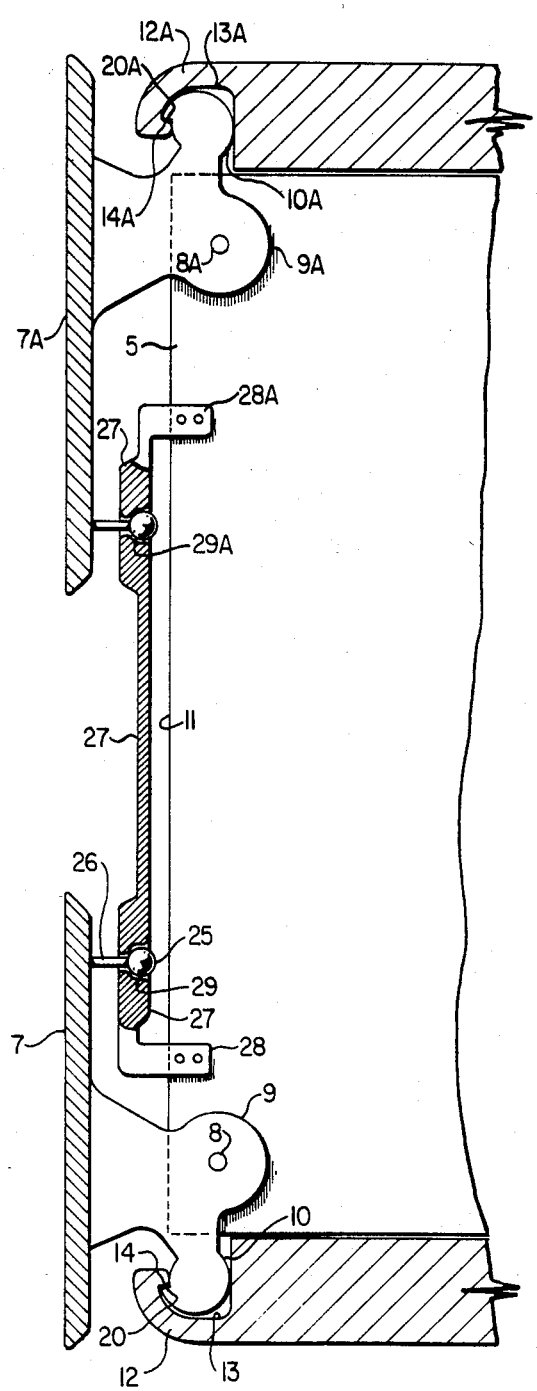

A better understanding of the invention will be obtained by reference to the detailed description below, in conjunction with th following drawings, in which:

FIG. 1 is a perspective view of a housing which contains a plurality of printed circuit boards to be locked therein, FIG. 2 is an enlarged detail of the printed circuit board lock in partially engaged position, FIGS. 3, 4 and 5 are views of the front corner of the printed circuit board showing how the lock fixes the printed circuit board into position, in three successive progressive views, and FIG. 6 is a side view of the front portion of a printed circuit board showing two printed circuit board locks.

Turning to FIG. 1, a housing 1 is shown within which a plurality of printed circuit boards 2 are held. The housing may of course simply be a rack shelf in which printed circuit boards are held. Upper and lower guides 3 and 4 retain the printed circuit boards in parallel relationship from front to rear of the housing, and serve to guide the printed circuit boards directly to mating connectors at the rear of the housing.

As described earlier, during transportion the housing often flexes and vibrates and the printed circuit boards are sometimes released from their connectors and can slip out of one or both guides, which sometimes damages the printed circuit boards.

Turning now to FIG. 2, a side view of the front bottom corner of the printed circuit board is shown. Printed circuit board 5 is passed into a printed circuit board housing or the like, sideways restrained by guides (not shown) in a well known manner. The bottom of a guide is depicted for illustration purposes as the surface 6. The printed circuit board is slid between the guides in the usual manner, between similar surfaces 6 at the top and bottom of the board, which generally fixes the position of the printed circuit board in a particular plane. Of course there will be some tolerance and play, since it is desired to slide the printed circuit board in smoothly, without binding. As the printed circuit board reaches close to the end of its travel it encounters a connector, for which considerable force is required to ensure mating.

The printed circuit board lock which is the subject of this invention can be used at the bottom front corner, top front corner, or preferably, both front corners of the printed circuit board.

According to the present invention, a lever 7 is rotatably attached to the printed circuit board at a fulcrum point 8. The manner of attachment is not critical, and can be, for example, a rivet having a head at one side of the printed circuit board, passing through a hole in the board and a hole in an extension 9 to the lever 7, and a washer and a C spring clamp which retains the entire assembly together. As lever 7 is moved, it is rotated about fulcrum point 8 on printed circuit board 5.

A latch 10 is also fixed to the lever. The latch is located at a position closer to the lever and closer to the outside end of the lever than the fulcrum point. Thus as the lever 7 is rotated into a position parallel to the front edge 11 of the printed circuit board 5, the latch 10 is rotated over-center relative to fulcrum point 8.

The latch 10 fits into a hook 12 which is shaped cooperatively with the latch 10.

Preferably the hook is comprised of a bottom ledge 13 having an upwardly shaped lip which itself has a top edge 14 which extends back over part of the ledge. The hook is fixed to the guide with the lip extending forwardly thereof. While the lip need not be fixed directly to the guide, it should be linked thereto at least through an intermediary structure since the position of the bottom of the printed circuit board relative to the hook should be predetermined and related to the interface between the board and the guide.

The latch preferably is comprised of a protrusion extending between the extension and the lever, past the printed circuit board. It has a periphery opposite to the lever which describes at least a 180° segment of a circle extending from a line parallel to the lever and preferably passing through the axis of the fulcrum. More generally, the portion of the latch which slides within the hook as the lever is moved should have a rounded periphery.

The periphery of the latch is indented close to the lever, cooperatively shaped to accept the lip when the latch is coupled into the hook.

It is preferred that the lip of the hook forward of the bottom ledge should be rounded with a similar radius as the latch. In addition, the distance from the inside of the ledge just under the lip, through the center of rotation of the latch when coupled into the hook should be the diameter of the latch.

It is preferred that the latch should extend below the bottom of the printed circuit board, although it is clear that with suitable design of the guide and hook, it can be restricted to a position alongside the printed circuit board.

Reference is now made to FIGS. 3, 4 and 5 in conjunction with FIG. 2.

Since the printed circuit board is held between surfaces 6, as it is slid into the housing the fulcrum point 8 can only take the position along line 15. When the printed circuit board is in its final position, fulcrum point 8 is at position 16. It should be noted that this is over-center relative to the center of rotation of latch 10, within hook 12.

With the printed circuit board initially slid into position, the lever 7 is at a wide angle relative to the front edge of printed circuit board 5, with latch 10 just being introduced into hook 12.

As lever 7 is rotated toward the front edge 11 of printed circuit board 5, the latch 10 drops to the bottom ledge 13 of the hook. Lever 7 is then pushed further to a position parallel to the front edge 11 of printed circuit board 5, causing further rotation of latch 10 in hook 12. The latch 10 becomes a fulcrum point, against which insertion stress of the printed circuit board can be exerted, and the printed circuit board is forced backward into the housing, into engagement with a connector. The fulcrum point 8 goes over-center relative to the rotation point of latch 10. Past the center point (i.e. over-center) latch 10 rises slightly within hook 12, with indentation 20 going into engagement with the top edge 14 of the lip of the hook.

Accordingly, with lever 7 held in position, even with considerable vibrational stress which widens the distance between top and bottom surfaces 6, the printed circuit board is locked into position against the adjacent surface 6, since it cannot move in any direction within the plane of the printed circuit board.

With the printed circuit board having a lock adjacent both its top and bottom edges, once locked the printed circuit board itself becomes a structural member of the housing and serves to strengthen resistance against widening the distance between top and bottom surfaces 6 during bouncing, vibration, etc. which is often encountered during transportation. A side view of a structure of this form is shown in FIG. 6.

Printed circuit board 5 has a bottom lever 7 and corresponding top lever 7A, extensions 9 and 9A of the levers being rotatably fixed to the printed circuit board at fulcrum points 8 and 8A respectively. A pair of latches 10 and 10A are fixed to levers 7 and 7A respectively which are similar to the structure described with reference to FIG. 2. The latches 10 and 10a are shown in FIG. 6 locked into position within hooks 12 and 12a.

It may be seen that with levers 7 and 7A positioned parallel to the front edge 11 of printed circuit board 5, the indentations 20 and 20A bear against top edges 14 and 14A of the hooks, leaving a space between the bottom edges 13 and 13A and the nearest edges of latches 10 and 10A.

Since the positions of the latches are over-center relative to the fulcrum points 8 and 8a, the latches tend both to retain their locked positions, and to force printed circuit board 5 into its mating connector (to the right of the printed circuit board in FIG. 6, not shown).

The double lock is highly effective and also forms a rigid structural member between the hooks 12 and 12A, which themselves are fixed to the printed circuit board housing. The resulting structure thus not only retains the printed circuit boards more securely than in the past, but helps increase the structural rigidly of the housing which further reduces the incidence of the printed circuit boards vibrating loose.

The lever 7 (or levers 7 and 7A) is preferably held in position using a structure to be described below, although other forms of lever latches can be used. A metal or plastic sphere 25 is disposed at one end of a narrow post 26, which has its other end fixed perpendicular to the inner edge of lever 7. A frame member 27 is attached to the printed circuit board 5 using any convenient means (such as rivets passing through retention flanges 28 and 28a) and extends forwardly of and parallel to the front edge 11 of the printed circuit board 5. The frame member 27 contains holes 29 and 29A having resilient edges, a diameter smaller than sphere 25, and approximately the diameter of post 26. The axis of hole 29 should be co-extensive with the axis of post 26 when lever 7 is rotated into parallel alignment with the front edge of the printed circuit board.

As lever 7 is rotated parallel to the front edge 11 of printed circuit board 5, locking the latch into the hook 12, sphere 25 is forced through hole 29 which, having resilient edges, opens to allow it to pass through. As soon as the sphere 25 is passed through, the resilient edges of hole 29 close, retaining the post in position. The lever 7 is thus held in position parallel to front edge 11 of printed circuit board 5, holding the lock closed.

Operation of lever 7A is similar to that described above, similar elements being given similar reference numerals with suffix A.

Use of the printed circuit board lock described above is expected to substantially reduce the installation time of complex equipment having a large number of printed circuit boards. Where in the past equipment was shipped with printed circuit boards already installed, having a high risk of damage, or being shipped with printed circuit boards separately packaged, which require installation on site, now complete racks of equipment involving large numbers of printed circuit boards can be shipped with printed circuit boards already installed, with security and safety. This is expected to considerably reduce cost since the printed circuit boards can be inserted using factory labour, the fully assembled equipment tested, and shipped as tested with confidence. The extra labour of removal of printed circuit boards at the factory and reinstallation on site is avoided.

A person understanding this invention may now conceive of changes or other embodiments using the principles described herein. All are considered to be within the sphere and scope of this invention as defined in the claims appended hereto.

I claim:
1. A printed circuit board lock comprising:
   (a) a lever,
   (b) means for rotatably attaching the lever to a printed circuit board at a fulcrum point spaced from the axis of the lever,
   (c) a latch fixed to the lever at a position closer to the lever and closer to one end of the lever than the fulcrum point, comprised of an indented portion and a protrusion having an orthogonal axis parallel to the axis of the fulcrum, and having a periphery opposite to the lever which describes at least a 180° segment of a circle extending from a line parallel to the lever passing approximately through the axis of the fulcrum,
   (d) guide means for directing the printed circuit board along a straight line, and
   (e) a hook connected to said guide means, having a lip portion thereof for cooperatively engaging said latch, and a bottom portion thereof being a distance from the fulcrum point no shorter than the distance between the fulcrum point and the edge of the latch opposite the fulcrum point, whereby said indentation of the latch is engaged and locked into the lip of said hook in response to the latch being rotated over centre relative to the fulcrum point, such that the printed circuit board is securely retained in the event of external vibration.
2. A printed circuit board lock as defined in claim 1, wherein said lip is upwardly shaped having a top edge thereof extending back over part of the ledge, the hook being fixed relative to said guide with said lip extending in a forward direction relative thereto; whereby rotational movement of the latch in all directions in the plane of the printed circuit board is impeded when the latch is coupled into the hook, rotational movement of the latch to release the latch being facilitated by rotation of the lever about the fulcrum, causing rotation of the latch in the hook, release of the lip from the indentation, and linear outward movement of the printed circuit board in its guide.
3. A printed circuit board lock as defined in claim 1 or 2, further including means for retaining the lever in a position which thereby retains the latch coupled into the hook and the printed circuit board fixed in position.
4. A printed circuit board lock as defined in claim 3, in which the latch extends below the bottom edge of the printed circuit board.
5. A printed circuit board lock as defined in claim 1 or 2, further including means for retaining the lever in a position parallel to the front of the printed circuit board with the latch in its over-center position.
6. A printed circuit board lock as defined in claim 5, in which the latch extends below the bottom edge of the printed circuit board.
7. A printed circuit board lock as defined in claim 1 or 2, further including a post protruding from the lever toward the printed circuit board at a position opposite to said one end, the post terminating in a sphere having diameter greater than the diameter of the post, a frame member at the front of the printed circuit board having a hole of a diameter narrower than said sphere, but having resilient edges, said hole being located adjacent the position of the sphere when the lever is rotated about the fulcrum point to a position parallel to the frame member, whereby the sphere can be forced against and through the hole and be held by the edges thereof.
8. A printed circuit board lock as defined in claim 7, in which the latch extends below the bottom edge of the printed circuit board.
9. A printed circuit board lock as defined in claim 1 or 2, in which the latch extends below the bottom edge of the printed circuit board.
10. A printed circuit board lock comprising:
   (a) a first and a second lever,
   (b) means for rotatably attaching the levers to a printed circuit board at corresponding fulcrum points spaced from the axes of the levers adjacent opposite front corners of the printed circuit board,
   (c) a first and a second hook, each having a lip portion thereof for coupling with said first and second lever respectively,
   (d) a latch fixed to each lever at opposed portions, each latch being at a position closer to its associated lever and closer to one end of its associated lever that the associated fulcrum point, and comprised of a protrusion having an orthogonal axis parallel to the axis of the associated fulcrum, and a periphery opposite to the associated lever which describes at least a 180° segment of a circle extending from a line parallel to the lever passing approximately through the axis of the fulcrum, and having an indentation cooperatively shaped to accept said lip portion of said hooks, and
   (d) guide means for orienting the printed circuit board in a vertical position between said pair of associated hooks, and for fixing the distance be- tween each fulcrum point and a bottom portion of said hooks, the distance being no shorter than the distance between the associated fulcrum point and the edge of the latch opposite the fulcrum point, whereby the latches are rotated over-center relative to their associated fulcrum points into engagement with said hooks and are locked therein in response to the levers being rotated about their fulcrum points, such that both the top and bottom of the front of the printed circuit boards are locked in position.

11. A printed circuit board lock comprising:
(a) a first and a second lever,
(b) means for rotatably attaching the levers to a printed circuit board at corresponding fulcrum points spaced from the axes of the levers adjacent opposite front corners of the printed circuit board,
(c) guide means for orienting the printed circuit board in a vertical position between a pair of cooperating hooks connected thereto, each hook being comprised of a bottom ledge and an upwardly shaped lip having a top edge extending back over part of the ledge and forwardly of the guide means, and
(d) a latch fixed to each lever at opposed portions, each latch being at a position closer to its associated lever and closer to one end of its associated lever than the associated fulcrum point and comprised of a protrusion having an orthogonal axis parallel to the axis of the fulcrum, and a periphery opposite to the associated lever which describes at least a 180° segment of a circle extending from a line parallel to the lever passing approximately through the axis of the fulcrum, an indentation in the periphery of each latch being cooperatively shaped to accept the lip when the latch is coupled into the associated hook, whereby the latches are rotated over-center relative to their associated fulcrum points into coupling engagement with said cooperating hooks and are locked therein in response to the levers being rotated about their fulcrum points such that both the top and bottom of the front of the printed circuit boards are locked in position such that rotational movement in all directions in the plane of the printed circuit board is impeded, rotational movement to release each latch being facilitated by rotating the levers about their fulcrums, thereby causing rotation of the latches in the associated hooks and releasing each lip from an associated indentation, causing linear outward movement of the printed circuit board in its guide.

12. A printed circuit board lock as defined in claim 10 or 11, further including means for keeping the levers in positions retaining the latches coupled into the hooks.

13. A printed circuit board lock as defined in claim 10 or 11, further including means for keeping the levers in positions parallel to the front of the printed circuit board with their associated latches in over-center position.

14. A printed circuit board lock as defined in claim 10 or 11, further including a post protruding from the adjacent portion of each lever toward the printed circuit board, each post terminating in a sphere having diameter greater than the diameter of the post, a frame member at the front of the printed circuit board having a pair of holes of diameter slightly narrower than said spheres but having resilient edges, said holes being located adjacent the positions of the spheres when the levers are rotated about the fulcrum points to positions parallel to the frame member, whereby the spheres can be forced against and through the holes and held by their edges.

15. A printed circuit board lock as defined in claim 10 or 11 in which the latches extend beyond the top and bottom edges respectively of the printed circuit board.

* * * * *